United States Patent [19]

Aoyama et al.

[11] Patent Number: 5,324,012
[45] Date of Patent: Jun. 28, 1994

[54] HOLDING APPARATUS FOR HOLDING AN ARTICLE SUCH AS A SEMICONDUCTOR WAFER

[75] Inventors: Masaaki Aoyama; Keiichi Kimura, both of Kanagawa, Japan

[73] Assignee: Nikon Corporation, Tokyo, Japan

[21] Appl. No.: 910,870

[22] Filed: Jul. 6, 1992

[30] Foreign Application Priority Data

Jul. 16, 1991 [JP] Japan .................................. 3-199801

[51] Int. Cl.$^5$ ............................................. B25B 11/00
[52] U.S. Cl. ...................................... 269/21; 269/286
[58] Field of Search ................. 269/21, 903, 286, 287, 269/296; 279/3; 51/235

[56] References Cited

U.S. PATENT DOCUMENTS

| | | | |
|---|---|---|---|
| 4,049,484 | 9/1977 | Priest et al. | 269/21 |
| 4,088,312 | 5/1978 | Frosch et al. | 269/21 |
| 4,131,267 | 12/1978 | Ono et al. | 269/21 |
| 4,183,545 | 1/1980 | Daly | 269/21 |
| 4,616,796 | 10/1986 | Inoue | 269/8 |
| 4,856,766 | 8/1989 | Huberts | 269/21 |
| 4,906,011 | 3/1990 | Hiyamizu et al. | 269/21 |
| 4,944,904 | 7/1990 | Singh et al. | 269/62 |
| 5,067,695 | 11/1991 | Huddleston | 269/21 |

FOREIGN PATENT DOCUMENTS

| | | | |
|---|---|---|---|
| 63-169243 | 7/1988 | Japan | 269/21 |
| 2-186656 | 7/1990 | Japan | |
| 64-120505 | 12/1990 | Japan | 269/21 |
| 4-35827 | 2/1992 | Japan | 269/21 |

*Primary Examiner*—Robert C. Watson
*Attorney, Agent, or Firm*—Keck, Mahin & Cate

[57] ABSTRACT

A holder which cleanly holds an article such as a semiconductor wafer and which is high in rigidity, light in weight, high in dimensional stability and excellent in dust resistance. The wafer holder includes a vacuum holding surface formed with a plurality of concentric or helical annular projections and annular vacuum holding grooves which are arranged at a given pitch. A plurality of vacuum holes for vacuum holding purposes are formed in the respective annular grooves so as to be arranged radially and each of the vacuum holes is subjected to pressure reduction by a vacuum source through the interior of the holder, thereby correcting the flatness of a wafer to conform with the upper surfaces of the annular projections. At least the portions of the holder which contact with the wafer (preferably the holder on the whole) are made of a sintered ceramic containing covalent bond-type conductive material such as a TiC-containing sintered $Al_2O_3$ so that the contact portions exhibit conductivity and also less pores are present in the surface, thereby practically preventing the occurrence and deposition of fine particles.

18 Claims, 4 Drawing Sheets

HOLDING APPARATUS FOR HOLDING AN ARTICLE SUCH AS A SEMICONDUCTOR WAFER

BACKGROUND OF THE INVENTION

1. Field of the Invention

The present invention relates to a holding apparatus well suited for use in the transfer or vacuum holding of a thin sheet-type substrate such as a semiconductor substrate (wafer) or a glass plate.

2. Description of the Prior Art

In the manufacturing process of semiconductor integrated circuits, various holding apparatus are used for the purpose of transferring or firmly holding in position a wafer. For instance, in an exposure apparatus performing an important role during the lithographic operation, a substrate vacuum chuck (wafer holder) is used for the purpose of firmly holding a thin sheet-type wafer within a given plane.

Generally, conventional holding apparatus of the above type includes transfer system components or a holder made of a metal or alumina ceramic (sintered $Al_2O_3$). Also, Japanese Laid-Open Patent No. 2-186656, proposes the use of a covalent bonding material such as diamond or sapphire for the portions which contact with a wafer so as to prevent the occurrence of fine particles due to abrasive wear.

Then, the holding apparatus of the type used in the manufacturing process of semiconductor integrated circuits, for example, must satisfy the following characteristic properties (a) to (e).

(a) Can prevent the deposition of fine particles (foreign particles) and the occurrence of chemical contamination of an article to be held: If foreign particles deposit on the wafer and the wafer supporting portions of the holding apparatus, this causes not only the breaking of connections and short-circuits in the transferred circuit pattern but also deterioration in the flatness of the wafer and hence deterioration in the resolution due to the deposited fine particles in cases where the holding apparatus is a wafer holder.

(b) Is high in hardness: In order to prevent any abrasive wear at the portions which contact with an article to be held, the contacting portions should preferably be high in hardness.

(c) Is high in rigidity/specific gravity value: In order to hold flat a thin-sheet wafer or to accurately transfer such wafer to a given position, the wafer supporting portions must be high in rigidity. In such case, the wafer supporting portions must be not only high in rigidity but also low in specific gravity in order to make the apparatus small in size and light in weight.

(d) Is low in coefficient of thermal expansion: In the case of the wafer holder of an exposure apparatus, for example, the exposure results in the accummulation of heat. Thus, if the holder is high in coefficient of thermal expansion, this causes an increase in the dimensional variation by exposure of the wafer held by vacuum on the holder. As a result, in order to suppress any dimensional error threatening to occur during the transfer of circuitry, the coefficient of thermal expansion should preferably be as low as possible.

(e) The working is easy: It is desirable that the grindability is so excellent as to produce a smooth surface and that the fine working required for vacuum holding is effected easily.

However, these characteristic properties are not satisfied as yet by the previously mentioned conventional holding apparatus.

To begin with, the holding apparatus of the type using the metal material for the wafer holding portions is not capable of avoiding the metal contamination of a wafer. Also, the metal material is not satisfactory in terms of wear resistance (hardness) and it is also disadvantageous from the standpoint of the rigidity/specific gravity value and the coefficient of thermal expansion.

On the other hand, while the holding apparatus of the type using the alumina ceramic is advantageous in that the rigidity/specific gravity value is high as compared with the metal material thereby ensuring reduction in the size and weight of the apparatus and also the coefficient of thermal expansion is considerably low as compared with the metal material, there are disadvantages that fine particles tend to easily deposit in the large number of pores present in the surface of the sintered alumina ceramic and that the alumina ceramic is an insulator thus causing the deposition of dust due to the generation of static electricity.

Also, with the apparatus proposed in the previously mentioned Japanese Laid-Open Patent No. 2-186656, while it is excellent from the standpoint of wear resistance, in the case of sapphire, for example, the deposition problem of fine particles due to static electricity remains unsolved since sapphire is an insulator. In addition, where the wafer holder, etc., are made of diamond or sapphire, three different methods including a method of using a single crystal material, a method of using a sintered powder and a method of using a surface coating are conceivable and they have the following deficiencies. Firstly, where the single crystal material is used, a large blank material of diamond is not available in the existing situation and a raw material of sapphire is not only expensive but also hard to work it. Further, where the sintered material is used, diamond and sapphire are materials which are hard to sinter. Even if the sintering is possible, it is considered that a great number of large pores are caused and moreover the use of cobalt (Co) or the like as a binder gives rise to a problem of metal contamination. Further, the method of using the coating has the danger of causing the separation of a coating film due to the difference in coefficient of thermal expansion between the coating film and its base material.

As described hereinabove, there has been known in the prior art no holding apparatus which satisfies the required characteristic properties, i.e., the insurance of the desired mechanical strength, the reduction in weight and the dimensional stability and which prevents the contamination of an article to be held such as a wafer due to the deposition of fine particles or the like.

SUMMARY OF THE INVENTION

It is the primary object of the present invention to provide a holding apparatus which has excellent dust resisting properties while satisfying the characteristic properties required for holding apparatus of the type used in such applications requiring to maintain the cleanability of an article to be handled, i.e., the insurance of the required mechanical strength, the reduction in weight and the dimensional stability.

In accordance with the present invention, the holding apparatus includes contact portions which directly contact with an article to be held such as a semiconductor substrate and at least the contact portions are made of a sintered ceramic including a covalent bond-type conductive material.

In accordance with a preferred aspect of the present invention, the contact portions for the article to be held are made of a sintered aluminum oxide ($Al_2O_3$) including titanium carbide (TIC).

As mentioned previously, in the holding apparatus according to the present invention the contact portions for the article to be held are made of the sintered ceramic including the covalent bond-type conductive material with the result that the characteristic properties possessed by the covalent bond-type conductive material, i.e., high hardness and conductivity are added to the characteristic properties inherently possessed by the sintered ceramic such as high rigidity and light weight. As a result, not only the wear resistance of the contact portions is improved thus preventing the occurrence of fine particles but also the generation of static electricity at the contact portions is prevented by simply electrostatically grounding these portions by conventional procedures thus reducing the deposition of fine particles. Also, in accordance with the present invention, instead of using a single crystal or polycrystal of the covalent bond-type conductive material for the construction of the contact portions, the covalent bond-type conductive material is dispersed into the base material ceramic for the sintered material forming the contact portions and then the ceramic is sintered for use, thereby making the manufacture easy and inexpensive.

Further, since the holding apparatus according to the present invention has excellent dust-resistant properties as well as such characteristic properties as high rigidity, light weight and high dimensional stability, it can be used advantageously in such applications where any dimensional variation due to the accumulation of heat presents a problem when the operation of high-speed transfer or the correction of the flatness of a thin sheet-type article to be held is effected.

Still further, as regards the sintered material forming the contact portions of the holding apparatus according to the present invention, the conditions for its forming and/or sintering operation can be suitably selected to control the occurrence of pores in the surface of the sintered material. In other words, generally the addition of the covalent bond-type conductive material to the sintered ceramic deteriorates the sinterability as compared with the case of the base material ceramic alone, it is possible to produce a sintered material having reduced pores through the combined use of an HP (hot press) or HIP (hot isostatic press) process. For instance, while TiC or one of the covalent bond-type conductive materials is less sinterable when used singly, if it is added to $Al_2O_3$ and sintered under the proper process conditions, a sintered material with less pores than the heretofore used alumina ceramic can be produced. Thus, due to the fact that in the holding apparatus of the present invention the contact portions for an article to be held can be composed of a sintered material having less pores, the surface pores into which foreign particles tend to deposit are decreased and moreover any foreign particles deposited on the surface of the contact portions, if any, can be easily cleaned and removed.

As the suitable covalent bond-type conductive materials for addition to the base material ceramic for the sintered material, specifically TiC, SiC, etc., may be cited. While its content in the sinter is suitably set, it must be added in an amount capable of ensuring the conductivity of the sinter (generally, materials having resistances of $10^{10}$ $\Omega$ ·cm or less are called conductors), whereas the sinterability is deteriorated if the content of the covalent bond-type conductive material is excessively large. As a result, the content is selected between 5 and 70% by weight, preferably on the order of 30% by weight.

In accordance with the present invention, the ceramic used as a sinter base material may be any other material than $Al_2O_3$ provided that it is excellent in sinterability and the desired mechanical strength is ensured. Where the requirement for the reduction in weight is not so great, $ZrO_2$ or the like may for example be used.

The following Table 1 illustrates the physical properties of various substances heretofore used as the materials for forming the contact portions of the holding apparatus and the sintered material used in the present invention (Table 1 shows by way of example the sintered $Al_2O_3$ containing TiC).

TABLE 1

| Material | Young's modulus kg/mm$^2$ | Specific gravity | Porosity | Electric resistance $\Omega$ cm | Hardness Hv | Coefficient of thermal expansion $\times 10^{-6}$ °C. | Electric discharge machinability |
|---|---|---|---|---|---|---|---|
| SUS | 20000 | 8.1 | o | $7 \times 10^{-5}$ | 200 | 17.3 | o |
| Aluminum | 7000 | 2.8 | o | | 200 | 23 | o |
| $Al_2O_3$ | 35000 | 3.8 | x | $\geq 10^{14}$ | 1800 | 7.1 | x |
| Zirconia | 26000 | 6.0 | o | $2 \times 10^{12}$ | 1700 | 8.9 | x |
| TiC + $Al_2O_3$ | 40000 | 4.2 | o | $3 \times 10^{-3}$ | 1900 | 7.8 | o |
| TiC | | | x | $180 \times 10^{-6}$ | 2900 | | o |
| Sapphire | | 4 | o | | | | x |
| Diamond | | 3.4 | o | | >7000 (knoop hardness) | 0.8 | x |

As will be seen from Table 1, the TiC-containing sintered $Al_2O_3$ used in the present invention is particularly apparent that its specific resistance is as low as about $10^{-3}$ $\Omega$ ·cm and it ensures a sufficient conductivity for the prevention of static electricity. Also, its good conductivity makes possible the electric discharge machining and the machining of complicated shapes is made easy. Further, its characteristic properties, i.e., the porosity, Young's modulus and hardness are sperior to those of the conventionally used alumina ceramic ($Al_2O_3$) and also the equivalent characteristic properties as the $Al_2O_3$ are ensured with respect to the coefficient of thermal expansion and specific gravity.

In Table 1, as will be seen from a comparison between the SUS (stainless steel) and aluminum and the TiC-containing sintered $Al_2O_3$, the sintered material used in the present invention is higher in rigidity/specific gravity value than the metals and it is especially advantageous for use in holders holding articles for which flatness is required and in transfer holding apparatus which must be small in size and high in speed. Also, the sintered material used in the present invention is much smaller in coefficient of thermal expansion than the metals and the dimensional variation of the sintered material is not great even in case where the heat due to, for example, the exposure over a long period of time is accumulated in the sintered material. In other words, it is possible to reduce the dimensional error due to a thermal deformation of the holder which may possibly be caused during the transfer of circuitry to the wafer firmly held by vacuum on the holder.

The above and other objects, features and advantages of the present invention will become more apparent from the following description of its embodiments which are illustrative without any intention of limitation when taken in conjunction with the accompanying drawings.

DESCRIPTION OF THE PREFERRED EMBODIMENTS

Figure 1:
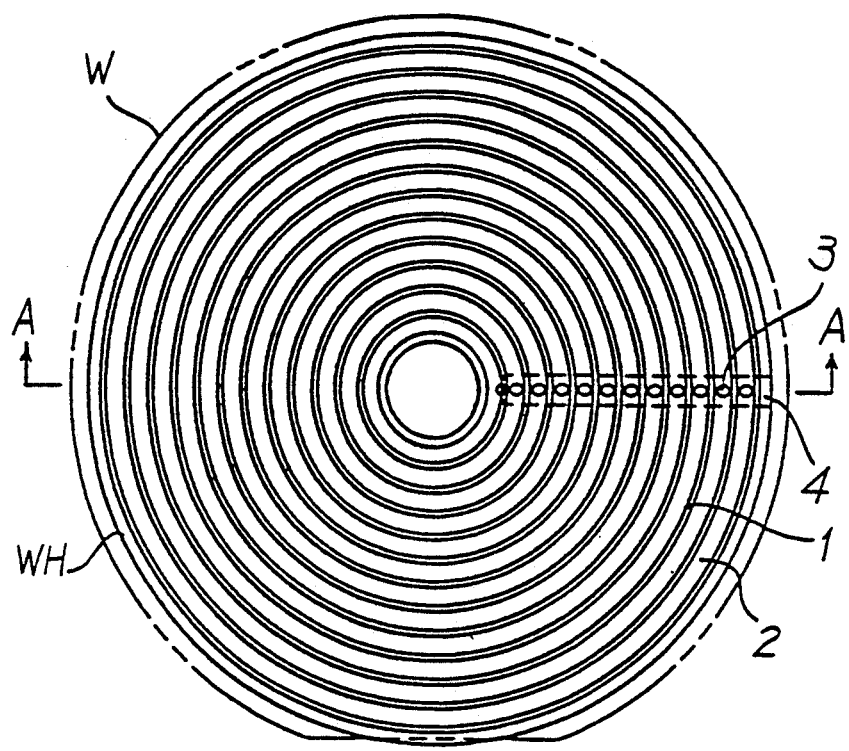
FIG. 1 is a plan view of a wafer holder according to a first embodiment of the present invention.
Figure 2:
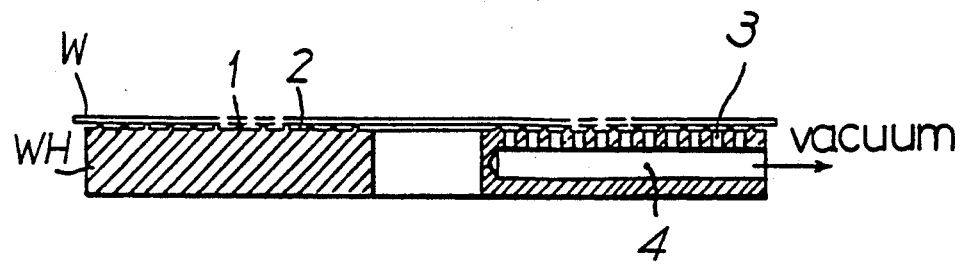
FIG. 2 is a sectional view taken along the line A—A' of FIG. 1.

FIGS. 1 and 2 show schematically the construction of a wafer holder according to a first embodiment of the present invention. In the Figures, the wafer vacuum holding surface of a wafer holder WH is formed into a circular shape of a diameter which is slightly smaller than the diameter of a wafer W, and the wafer holding surface is formed with a plurality of annular projections 1 (wafer supporting portions) and annular grooves (vacuum holding grooves) which are concentrically (or helically) arranged radially from the center of the wafer holder WH at a constant pitch in the like manner as rims.

In this embodiment, the wafer holder WH proper is wholly made of a TiC-containing sintered $Al_2O_3$ and the pore distribution in the wafer holding surface is such that less than 300 pores of over 10 $\mu$m in maximum size are present per $mm^2$. Also, the annular projections 1 of the wafer holding surface are machined to have a ridge width of 0.02 to 0.15 mm so as to reduce the probability of the deposition and riding of dirt. This machining can be easily effected by electric discharge machining or grinding operation. In addition, every side of the wafer holder WH is finished to produce a smooth surface having a surface roughness of 5 $\mu$m Rmax or less and every boundary between the sides are smoothly chamferred.

On the other hand, the annular grooves 2 are respectively formed with channels comprising vacuum holes or suction holes 3 which are arranged radially and the vacuum holes 3 are communicated with a manifold or sleeve-like hole 4 extended radially within the wafer holder WH. The hole 4 is connected to a vacuum source for pressure reducing purposes so that a negative pressure is produced within the space enclosed by the back of the wafer W and the annular grooves 2 and the resulting holding action causes the back of the wafer W to be corrected in conformity with the tops of the plurality of annular projections 1, thereby making the wafer flat.

At this time, due to the fact that the whole wafer holder WH is a good conductor, the charges by static electricity are grounded through the metal members supporting the holder and therefore there is caused no deposition of the fine particles around the holder due its charging. Also, since the wafer holder WH is high in hardness, practically its abrasive wear with the wafer and hence the resulting production of fine particles are eliminated and the amount of production of fine particles tending to deposite on the wafter is reduced extremely.

Further, since there are less pores in the surface of the wafer holder WH, there is very rare possibility for the deposition of fine particles in the pores which may possibly be redeposited on the wafer W or alternatively the chances of fine particles existing between the wafer holder WH and the wafer W are so small that deterioration in the flatness of the wafer W hardly tends to occur. Also, even if the deposition of fine particles on the surface of the wafer holder takes place, there are less pores in the holder surface so that the particles can be removed easily and the cleaning of the wafer holder WH is simplified.

Still further, the wafer holder WH of this embodiment is such that the coefficient of thermal expansion is small and the amount of dimensional variation due to the accumulation of heat during the exposure is reduced. Thus, even in cases where the exposure is effected with a low-intensity light over a long period of time, the dimensional error of the wafer can be reduced to less than a permissible limit.

In addition, since the TiC-containing sintered $Al_2O_3$ is low in specific gravity and thus the wafer holder of this embodiment is light in weight, where the step and repeat-type exposure is effected, the load on the driving system for moving the wafer holder WH is reduced and thus an excellent driving response characteristic is obtained.

Figure 3:
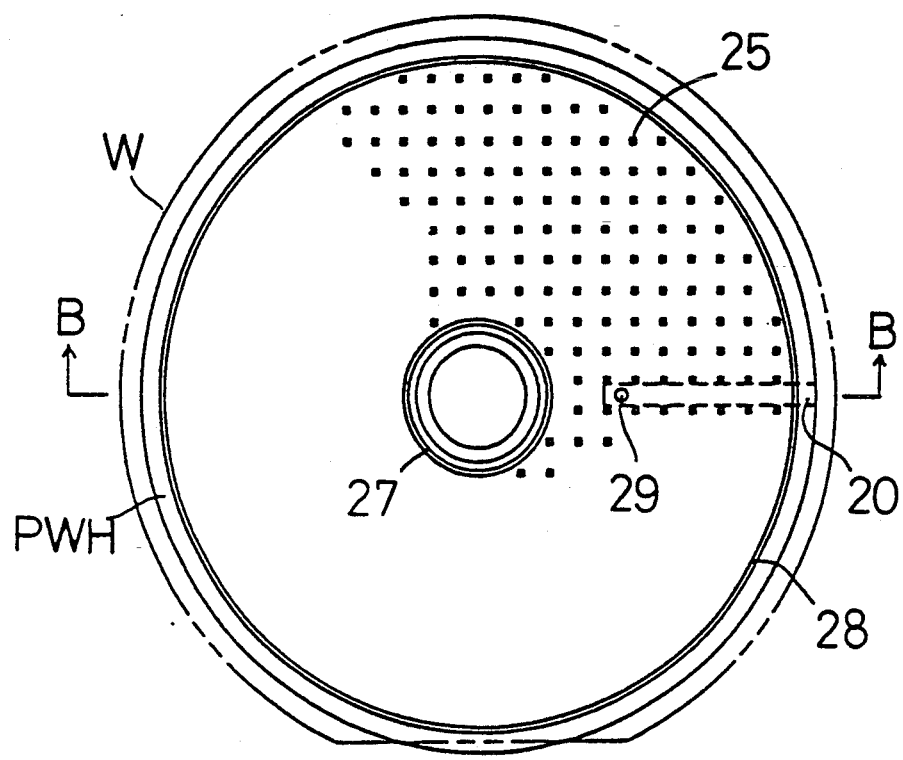
FIG. 3 is a plan view of a wafer holder according to a second embodiment of the present invention.
Figure 4:
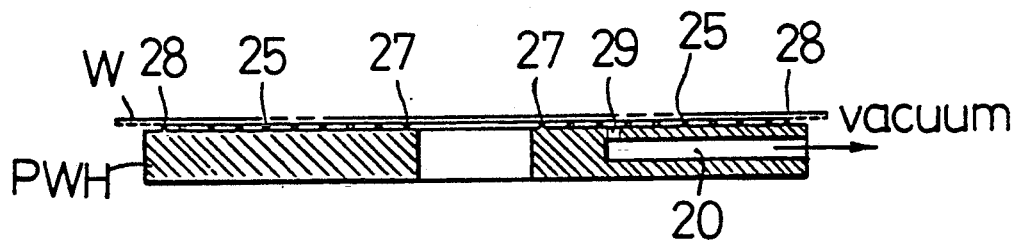
FIG. 4 is a sectional view taken along the line B—B' of FIG. 3.

A second embodiment of the present invention will now be described. FIGS. 3 and 4 show schematically the construction of a wafer holder (pin chuck-type holder) PWH according to the second embodiment. In the Figures, the wafer holder PWH is made of the same TiC-containing sintered $Al_2O_3$ as in the case of the first embodiment and its wafer holding surface is formed with a plurality of pin-type projections 25 (wafer supporting portions) by electric discharge machining, grinding operation or the like. The pin-type projections 25 are each formed into a cylindrical or square pillar shape having a diameter (or the length of each side) of about 0.02 to 0.1 mm and a pin height of 0.01 to 0.5 mm. Also, closed annular projections 27 and 28 of practically the same height as the pin-type projections are respectively formed on the innermost side and the outermost side of the wafer holding surface similarly by the electric discharge machining, grinding operation or the like, and each of these annular projections has an width of 0.02 to 0.15 mm. The surfaces of the various portions of the wafer holder PWH are subjected to smooth finish as in the case of the first embodiment.

The underside wafer holding surface is formed with channels comprising vacuum holes or suction holes 29 which are arranged radially and the vacuum holes 29 are communicated with a sleeve-type hole or manifold 20 extended radially inside the wafer holder PWH. By connecting the hole 20 to a vacuum source for pressure reduction, a negative pressure is produced within the space enclosed by the wafer W and the annular projections 27 and 28 so that the resulting holding action corrects the back side of the wafer W to conform with the tops of the plurality of pin-type projections 25 and thus the wafer is held in its flattened condition.

At this time, due to the fact that the wafer holder PWH of this embodiment is a good conductor as in the case of the first embodiment and that it possesses the various characteristic properties such as high hardness, high rigidity, light weight and high dimensional stability, an excellent dust resisting effect is obtained and it is also advantageous from the standpoint of operating characteristics and dimensional stability.

It is to be noted that while, in the above-described first and second embodiments, the whole wafer holder is made of the TiC-containing sintered $Al_2O_3$, depending on the circumstances, only the portions which directly contact with a wafer W, i.e., the annular projections 27 and 28 and the pin-type projections 25 may be made of the TiC-containing sintered $Al_2O_3$. However, there is also the danger of the fine particles deposited in the grooves of the holder being deposited on the wafer W and it is needless to say that the dust proof can be ensured more positively by composing the whole wafer holder with the TiC-containing $Al_2O_3$. Also, it is preferable that the whole wafer holder is made of the TiC-containing sintered $Al_2O_3$ from the standpoint of mechanical strength, reduced weight and dimensional stability.

Figure 5:
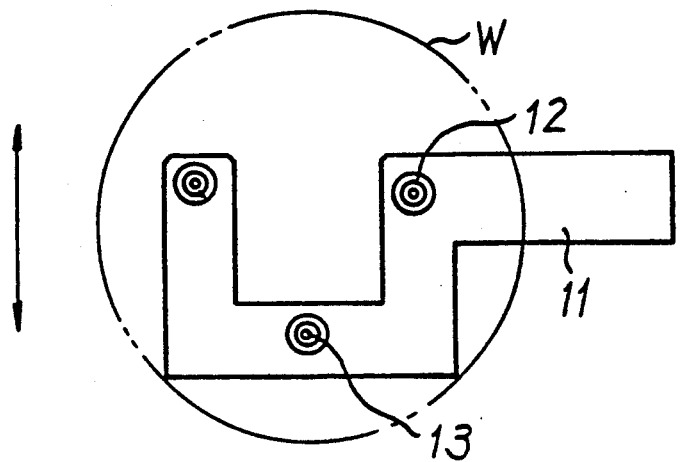
FIG. 5 is a plan view showing the principal part of a wafer transfer apparatus according to a third embodiment of the present invention.
Figure 6:
FIG. 6 is a side view of the principal part of the transfer apparatus of FIG. 5.

Next, a third embodiment of the present invention will be described. FIGS. 5 and 6 show schematically the construction of the principal parts of a wafer transfer apparatus according to the third embodiment. In the Figures, a plurality of projecting members 12 made of a TiC-containing sintered $Al_2O_3$ are fixedly mounted on the upper surface (wafer W loading surface) of an arm 11 by such method as adhesion, bonding or clamping. In accordance with the present embodiment, there is a room in the thickness direction of the arm 11 and therefore the arm 11 is made of a conductive material such as aluminum, carbon fiber reinforced resin or conductive plastic material (any of these materials can ensure a usable mechanical strength if the thickness is large enough). Also, after the projecting members 12 have all been mounted on the arm 11, their upper surfaces are subjected to flat working by grinding or lapping operation and therefore they have a sufficient flatness.

If the transfer apparatus shown in FIGS. 5 and 6 is used, during the transfer of a wafer there is practically the occurrence of no static electricity and the occurrence of no fine particles due to wear of the wafer and its supporting portions (the upper surfaces of the projecting members 12) and therefore there is practically no danger of any fine particles depositing on the wafer.

Figure 7:
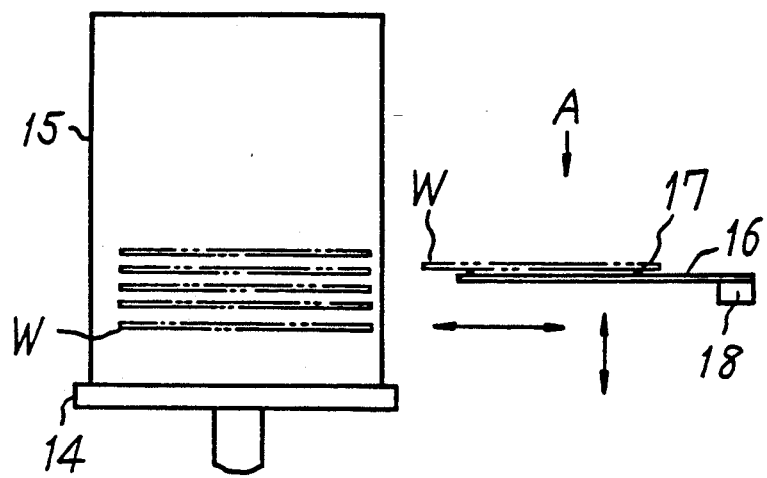
FIG. 7 is a schematic view showing the construction of the principal part of a wafer transfer apparatus according to a fourth embodiment of the present invention.
Figure 8:
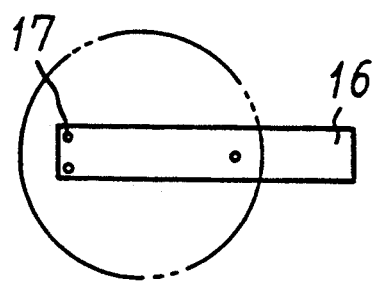
FIG. 8 is a plan view of the principal part looked from the direction of an arrow A in FIG. 7.

A fourth embodiment of the present invention will now be described. FIGS. 7 and 8 show schematically the principal parts of a wafer transfer apparatus according to the fourth embodiment. This wafer transfer apparatus is adapted for moving a wafer W to and from any selected one of the shelf positions within a wafer storage cassette 15 set on a pedestal 14. In the Figures, the cassette 15 is provided with an opening in its side on the right side of the paper plane and a plurality of wafer supporting shelves formed into substantially a C-shape are arranged at intervals of 2 to 3 mm in the height direction on both sides within the cassette 15.

The transfer apparatus of this embodiment is provided with a transfer arm 16 which is movable in the lateral and vertical directions within the plane of the paper and the transfer arm 16 is attached by a fixing member 18 to an arm driver which is not shown. Formed on the upper surface of the arm 16 are a plurality of projecting members 17 each having a vacuum hole 13. The width of the arm 16 is smaller than the width of the opening between the right and left shelves within the cassette 15 and the amount of arm movement is controlled by drive means (not shown) in accordance with the wafer storage pitch (the vertical shelf spacing) within the cassette 15.

With the transfer apparatus according to this embodiment, when a wafer W is moved in or out, the arm 16 must be inserted into the gap of as small as 2 to 3 mm and in this case the arm 16 must be prevented from contacting with the upper surface of the adjoining wafer W, thus making it necessary to ensure a high rigidity with a thin plate thickness for the arm 16. For this purpose, in the transfer apparatus of this embodiment both the arm 16 and the projecting members 17 are wholly made of TiC-containing sintered $Al_2O_3$.

With the transfer apparatus of the present embodiment, in order to store a wafer W into the cassette 15, the wafer W is transferred onto the arm 16 from above in the plane of the paper so that the back of the wafer W is held and supported by vacuum on the projecting members 17. Then, the position of the arm 16 is adjusted vertically in the plane of the paper by the driving means so that it is placed in a position corresponding to the selected shelf for storing the wafer W within the cassette 15. Thereafter, the arm 16 is moved toward the left in the plane of the paper and it is stopped upon reaching the given position within the cassette 15. Then, the arm 16 is slightly moved downward so that the wafer W is transferred onto selected one of the right and left shelves within the cassette 15.

At this time, since the arm 16 and the projecting members 17, which are made of the TiC-containing sintered $Al_2O_3$, are good conductors and are high in hardness, during the transfer of the wafer practically there are no generation of static electricity and no occurrence of fine particles due to abrasive wear of the wafer and its supporting portions (the upper surfaces of the projecting members 17) and therefore there is practically no danger of fine particles depositing on the wafer. Also, since the arm 16 of this embodiment is light in weight and high in rigidity, there is no danger of causing any damage to the wafers on the adjoining shelves due to any inclination or distortion of the arm 16 when the wafer is moved in and out and it is also advantageous in the case of high-speed operation.

While, in the foregoing description, the holding apparatus for holding or transferring a wafer in the manufacture of semiconductor integrated circuits have been explained, it is needless to say that articles to be held according to the present invention are not limited to wafers and the present invention is also applicable to transfer apparatus for glass plates, etc., holders for various test apparatus and assembling apparatus for electronic components. In this case, the shape and construction of the holding portions are not limited in any way and therefore, in addition to carrying and holding an article to be held, the holding portions may for example be constructed so as to clamp an article to be held.

What is claimed is:

1. A holding apparatus for holding an article such as a semiconductor wafer, said apparatus comprising:
   contact means for directly contacting with an article to be held, having a projecting and an non-projecting surface and a channel leading from a manifold to an opening in the non-projecting surface of the contact means, through which suction can be applied to hold the article against the projecting surface;
   said contact means being made of a sintered ceramic material including a covalent bond-type conductive material, and having sufficient conductivity to electrically ground the article.

2. A holding apparatus according to claim 1, wherein said apparatus is adapted to hold a semiconductor substrate as said article.

3. A holding apparatus according to claim 1, wherein said sintered material comprises a sintered aluminum oxide containing titanium carbide.

4. A holding apparatus according to claim 1, wherein said sintered material comprises a sintered aluminum oxide containing silicon carbide.

5. A holding apparatus according to claim 1, wherein the content of said covalent bond-type conductive material in said sintered material is between 5 and 70% by weight.

6. A holding apparatus for holding a semiconductor substrate by vacuum comprising:
   a holder for holding one side of said semiconductor substrate; and
   contact means formed on said surface of said holder to directly contact with said semiconductor substrate, having a projecting and an non-projecting surface and a channel leading from a manifold to an opening in the non-projecting surface of the contact means, through which suction can be applied to hold the substrate against the projecting surface;
   said contact means being made of a sintered ceramic material including a covalent bond-type conductive material, and having sufficient conductivity to eclectically ground the article.

7. A holding apparatus according to claim 6, wherein said contact means comprises a plurality of annular projections formed concentrically or helically on said surface, and wherein an annular vacuum holding groove is formed between every adjacent ones of said annular projections.

8. A holding apparatus according to claim 6, wherein said holder including said contact means is entirely formed by using said sintered ceramic material containing a covalent bond-type conductive material.

9. A holding apparatus according to claim 6, wherein said contact means comprises a pair of concentric inner and outer annular projections formed in a radially spaced relation on said surface, and a plurality of fixed pin type projections formed between said annular projections on said surface, wherein said annular projections and said pin type projections are substantially the same in height, and wherein a space for holding said semiconductor substrate by vacuum is formed among said pin type projections.

10. A holding apparatus according to claim 9, wherein said holder including said contact means is entirely formed by said sintered ceramic material containing a covalent bond-type conductive material.

11. A holding apparatus for holding a semiconductor substrate at a forward end of a transfer arm for transferring said semiconductor substrate, said apparatus comprising:
   a plurality of contact means formed with substantially a uniform height on a surface of said arm to directly contact with one side of said semiconductor substrate, said contact means being made of a sintered ceramic material including a covalent bond-type conductive material, and having sufficient conductivity to electrically ground the article, and said contact means comprising a projecting and a non-projecting surface and a channel leading from a manifold to an opening in the non-projecting surface of the contact means, through which suction can be applied to hold the substrate against the projecting surface.

12. A holding apparatus according to claim 11, wherein at least one of said projecting members is provided with a vacuum holding hole opened at a top thereof.

13. A holding apparatus according to claim 11, wherein said arm including said projecting members is entirely made of a sintered ceramic material containing covalent bond-type conductive material.

14. A holding apparatus according to claim 1, wherein the content of said covalent bond-type conductive material in said sintered material is about 30% by weight.

15. A holding apparatus according to claim 1, wherein the porosity of the ceramic material is sufficiently low to substantially eliminate deposition of dust particles in the pores.

16. A holding apparatus according to claim 1, wherein the porosity of the ceramic does not exceed about 300 pores of over 10 micron size per $mm^2$.

17. A holding apparatus according to claim 6, wherein the sintered material comprises a first compound selected from the group consisting of zirconium oxide and aluminum oxide and a second compound selected from the group consisting of titanium carbide and silicon carbide.

18. A holding apparatus according to claim 1, wherein the conductive material is dispersed into the ceramic base material prior to sintering.

* * * * *